(12) United States Patent
Chang

(10) Patent No.: US 10,416,396 B2
(45) Date of Patent: Sep. 17, 2019

(54) PHOTOELECTRIC CONVERSION MODULE

(71) Applicant: AQUAOPTICS CORP., Hsinchu County (TW)

(72) Inventor: Chia-Chi Chang, Taipei (TW)

(73) Assignee: AQUAOPTICS CORP., Hsinchu County (TW)

( * ) Notice: Subject to any disclaimer, the term of this patent is extended or adjusted under 35 U.S.C. 154(b) by 0 days.

(21) Appl. No.: 15/681,447

(22) Filed: Aug. 21, 2017

(65) Prior Publication Data

US 2019/0011652 A1   Jan. 10, 2019

(30) Foreign Application Priority Data

Jul. 4, 2017   (TW) .............................. 106122435 A (51) Int. Cl.
*G02B 6/42* (2006.01)
*H05K 1/18* (2006.01)
*H05K 1/02* (2006.01)
*G02B 6/32* (2006.01)

(52) U.S. Cl.
CPC ........... *G02B 6/4206* (2013.01); *G02B 6/428* (2013.01); *G02B 6/4214* (2013.01); *H05K 1/0274* (2013.01); *H05K 1/181* (2013.01); *G02B 6/32* (2013.01); *G02B 6/4259* (2013.01); *G02B 6/4295* (2013.01); *H05K 2201/10121* (2013.01); *H05K 2201/10674* (2013.01)

(58) Field of Classification Search
CPC .... G02B 6/4214; G02B 6/4206; G02B 6/428; G02B 6/4295; G02B 6/32
See application file for complete search history.

(56) References Cited

U.S. PATENT DOCUMENTS

| 9,470,864 B1* | 10/2016 | Yo ......................... G02B 6/428 |
| 9,581,776 B1* | 2/2017 | Lee ....................... G02B 6/4292 |
| 2012/0020621 A1* | 1/2012 | Zhou ..................... G02B 6/4206 385/33 |
| 2012/0241795 A1* | 9/2012 | Chang .................. G02B 6/4201 257/98 |
| 2017/0126318 A1* | 5/2017 | Chang .................... G02B 6/428 |

* cited by examiner

*Primary Examiner* — Thomas A Hollweg
*Assistant Examiner* — Mary A El-Shammaa
(74) *Attorney, Agent, or Firm* — Chih Feng Yeh; Huntington IP Consulting Co., Ltd.

(57) ABSTRACT

A photoelectric conversion module comprises an optical bench having at least one lens array; a circuit board having conductive trace formed on the circuit board, configured on the optical bench; at least one optical element flip-chip packaged on the circuit board to couple to the conductive trace; and an optical waveguide having an optical reflection structure, wherein the at least one lens array aligns to the optical reflection structure or the at least one optical element.

17 Claims, 8 Drawing Sheets

PHOTOELECTRIC CONVERSION MODULE

BACKGROUND OF THE INVENTION

Field of the Invention

The present invention relates to a photoelectric device, and more particularly, to a photoelectric conversion module which provides signal transmission and conversion between optical devices and electrical devices.

Description of Related Art

Light beams or optical signals are frequently used to transmit digital data between electronic devices, both over long distances and between adjacent circuit boards. A light beam may be modulated as needed to carry data. An optical signal may also be used for other purposes including position or motion sensing, measurement, etc.

Consequently, optical technology plays a significant role in modern electronic devices, and many electronic devices employ optical components. Examples of such optical components include optical or light sources such as light emitting diodes and lasers, waveguides, fiber optics, lenses and other optics, photo-detectors and other optical sensors, optically-sensitive semiconductors, and others.

Optical fiber connector can be divided into active type and passive type, the difference is that the active optical fiber connector contains photoelectric conversion component. However, the active optical fiber connector can only be connected to the electronic device with electrical connection port, but not connected to the electronic device with optical connection port; and the passive optical fiber connector can only be connected to the electronic device with optical connection port, but not connected to the electronic device with electrical connection port. The use of the optical fibers requires photoelectric conversion modules to convert electrical signals to optical signals, or optical signals to electrical signals. Also, the photoelectric conversion modules are attached to be fixed to ends of the optical fibers, or to be attachable to or detachable from ends of the optical fibers.

The conventional photoelectric conversion module utilizes printed circuit board as a main structure, and a laser diode, a photo detector, a control IC, a driver IC and an optical coupled device are packaged on the printed circuit board. Such packaging structure has the following disadvantages: (1) as the optical coupled element is fixed on the printed circuit board, it needs to consider the horizontal accuracy of packaging, but also needs to consider the vertical accuracy of the package; (2) optical signal within the optical coupled element with a longer optical path (about 2~3 mm), the optical field may be collimated in the internal of the optical coupled element by the lens, but the beam characteristics continues to diffuse. The longer optical path leads to the optical efficiency reduction and more interference between different channels.

In the photoelectric conversion module structure free of optical bench, the horizontal plane (X-axis and Y-axis) package requires high precision of packaging, in order to avoid laser diode (LD) and photo detector (such as photo diode (PD)) beyond the range of beam reflection surface. In addition, as substrate of the circuit board uses rigid material, the optical path is bound to elongate, so it is necessary to form micro lens on the circuit board by semiconductor manufacturing process. However, fabrication of the micro lens needs to avoid the range of internal wires, which will limit the size of the micro lens, and thereby unfavorable to the design of the photo detector section.

In view of the limitation and disadvantages of the conventional photoelectric conversion module structure, the invention provides a new photoelectric conversion module structure to overcome the disadvantages.

SUMMARY OF THE INVENTION

In this invention, a photoelectric conversion module is proposed. The photoelectric conversion module comprises an optical bench having at least one lens array; a circuit board having conductive trace formed thereon; at least one optical element flip-chip configured on the circuit board; and an optical waveguide having a beam bendable structure, wherein the at least one lens array aligns to the beam bendable structure or the at least one optical element. The circuit board is configured on the optical bench. The optical waveguide is configured on the optical bench. The at least one optical element is coupled to the conductive trace on the circuit board.

According to one aspect of the invention, the at least one lens array includes a first lens array and a second lens array, the first lens array aligning to the beam bendable structure and the second lens array aligning to the at least one optical element.

According to another aspect of the invention, the at least one lens array includes a first lens array and a second lens array, the first lens array aligning to the beam bendable structure and the second lens array aligning to one end of the optical waveguide.

According to yet another aspect of the invention, the at least one lens array includes a first lens array and a second lens array, the first lens array aligning to the at least one optical element and the second lens array aligning to one end of the optical waveguide.

According to one aspect of the invention, the at least one lens array includes a first lens array, a second lens array and a third lens array, the first lens array aligning to the beam bendable structure, the second lens array aligning to the at least one optical element and the third lens array aligning to one end of the optical waveguide.

One end of the optical waveguide extends outside of the optical bench to connect to an external optical element.

The photoelectric conversion module further comprises an external optical element configured on the optical bench. The beam bendable structure is a concave structure. The beam bendable structure is a V-shape trench structure. The at least one optical element is a light source chip, a photo diode chip, a photo detector chip or a photosensitive chip. The photoelectric conversion module further comprises at least one IC formed on the circuit board. At least one IC is a driver integrated circuit (IC), a control IC or a trans-impedance amplifier (TIA) chip. The circuit board is attached on the optical bench by using an adhesive material. The optical waveguide is made of a flexible material.

According to an aspect of the invention, the optoelectronic bench is coupled to the printed circuit board by wire bonding or flip board mounting.

A method for manufacturing a photoelectric conversion module comprises: providing an optical waveguide configured on a first optical bench; providing a circuit board configured on a second optical bench; and combining the first optical bench with the second optical bench to form the photoelectric conversion module.

The first optical bench has a first lens array and the second optical bench has a second lens array. The first optical bench is combined with the second optical bench by aligning the first lens array to the second lens array.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1:
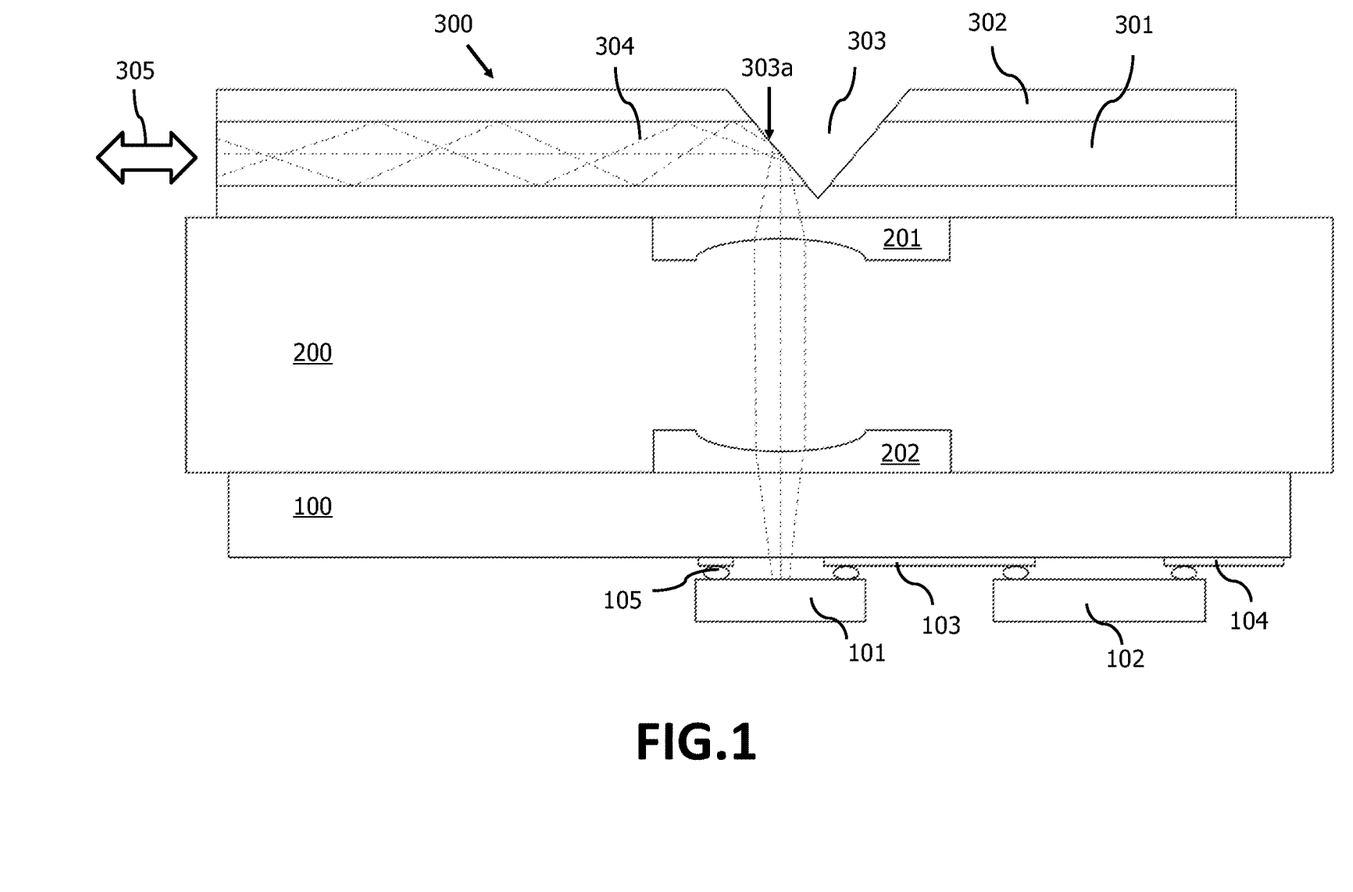
FIG. 1 illustrates a cross-sectional view showing a photoelectric conversion module according to one embodiment of the invention.

A photoelectric conversion module of the invention includes three portions:
(1) Optical waveguide: optical layer, the optical waveguide may be made of plastic material, which includes core portion and clad portion to construct the optical waveguide structure; in addition to the output and input of optical signals, the optical waveguide is also used for non-coplanar bending of the optical signals (via optical reflection surface of V-trench);
(2) Circuit board: electrical layer, provides a light source chip (such as laser diode (LD)), a light receiving device (such as photo diode (PD)), a control IC and a driver IC are flip-chip packaging on an optical bench, and conductive trace for internal signal connection and external circuits connection;
(3) Optical bench: main body of the photoelectric conversion module, provides a platform for integrating the optical waveguide and the circuit board; optical signals between the LD, PD and the optical waveguide may be optically coupled via lens integrated into the optical bench, and the optical bench and the lens can be fabricated simultaneously by an injection molding process FIG. 1 illustrates a cross-sectional view showing a photoelectric conversion module according to one embodiment of the invention. The photoelectric conversion module may be as an optical transmitter, an optical receiver or an optical transceiver, for unidirectional transmission or bidirectional transmission. In this embodiment, the photoelectric conversion module includes an interposer or circuit board 100, an optical bench 200 and an optical waveguide 300. The photoelectric conversion module can receive and transmit optical signals via the optical waveguide. In one embodiment, the photoelectric conversion module further comprises an optical ferrule (not shown) for engaging/connecting the optical bench 200 and optical fibers element.

In one embodiment, the optical waveguide 300 includes a core 301 formed at a center thereof, and a cladding 302 surrounding the core 301. The reflective index of the core 301 is larger than that of the cladding 302. For example, the core 301 and the cladding 302 are made of flexible material, such as polymer. The cladding 302 covers the core 301. In another embodiment, a coating layer is coated on an outer surface of the cladding 302 in order to protect the core 301 and the cladding 302. In one embodiment, the reflective index (n) of the core is 1.35~1.70 and the reflective index of the cladding is 1.35~1.70. The optical waveguide 300 has a beam bendable structure 303, such as concave structure, V-shape trench with an optical micro-reflection surface (mirror) 303a at one side of (within) the V-shape trench. The mirror 303a has a specified angle (such as 45 degree angle or other degree angle relative to vertical direction). The V-shape trench 303 of the optical waveguide 300 has a specified depth (vertical thickness). The first end of the V-shape trench 303 of the optical waveguide 300 forms a reflection surface. The V-shape trench 303 has a first slant plane and a second slant plane, wherein the first slant plane is opposite to the second slant plane. Vertical thickness of the V-shape trench 303 is larger than the core 301 of the optical waveguide 300, and the V-shape trench 303 is passing through the core 301 of the optical waveguide 300 such that the core 301 at cut surface of the V-shape trench 303 is exposed. The V-shape trench 303 may be formed by an imprinting process, a wedge cutting process, a laser cutting process or an etching process. In another embodiment, the V-shape trench 303 may be formed by a lithographic and etching process.

The optical waveguide 300 is configured on an upper surface of the optical bench 200, and the circuit board 100 is configured on a lower surface of the optical bench 200. For example, the optical waveguide 300 is attached onto the upper surface of the optical bench 200 by an adhesive material (such as epoxy), and the circuit board 100 is attached onto the lower surface of the optical bench 200 by an adhesive material (such as epoxy). In one embodiment, the optical bench 200 can be fabricated by an injection molding process, for example a plastic injection molding process, to form the lens array 201 and 202. In other words, the lens array 201 and 202 are integrated or formed on the optical bench 200. The optical bench 200 has double sides lens array 201 and 202 which locates under the upper surface and on the lower surface of the optical bench 200, respectively.

The lens array 201 locates under the V-shape trench 303 of the optical waveguide 300. The curvature of the lens array 201 locates under the upper surface of the optical bench 200 to align or face to the reflection surface 303a of the V-shape trench 303 such that the beams can be transmitted between the reflection surface 303a and the curvature of the lens array 201. The lens array 202 locates above the light source chip 101 and the light receiving element of the circuit board 100. The curvature of the lens array 202 locates on the lower surface of the optical bench 200 to align or face to the light source chip 101 and the light receiving element such that the beams can be transmitted between the light source chip 101/the light receiving element and the curvature of the lens array 202. The lens array 201 aligns to the lens array 202, and the curvature of the lens array 201 faces to the curvature of the lens array 202 such that the beams can be transmitted between the lens array 201 and the lens array 202. The lens array 201 and 202 is used to focus/collimate (at convex surface), diverge (at concave surface) or guide light. The lens array 201 and 202 can be used to enhance the efficiency of optical usage and to increase the allowable value of the package of optical components.

In one embodiment, the optical elements are flip-chip packaged on the circuit board 100. For example, a light source chip (such as laser diode, LED, Vertical-Cavity Surface-Emitting Laser (VCSEL)) 101 and a light receiving element (such as optical sensor) or a photo detector chip (not shown) are flip-chip packaged on the circuit board 100. In addition, ICs are flip-chip packaged on the circuit board 100. For example, a driver IC 102 and a control IC, a trans-impedance amplifier (TIA) chip, or others active components (not shown) are flip-chip packaged on the circuit board 100. In one embodiment, at least one passive component (such as resistor, capacitor, inductor) may be configured on the circuit board 100. In one embodiment, conductive trace 207 may be formed (configured) on the circuit board 200. The inner signal transmission conductive trace 103 and the outer signal transmission conductive trace 104, for example metal trace, are configured on the circuit board 100. The conductive trace 103 and the conductive trace 104 are formed by an identical process of manufacturing. The light source chip 101, the light receiving element and ICs are packaged/configured on the circuit board 100 by a flip-chip packaging process. The conductive trace 104 on the circuit board 100 is electrically connected to the external circuit (bonding pads on printed circuit board), by wire bonding electrically connecting or directly electrically connecting (such as flip-chip packaging). The conductive trace 103 on the circuit board 100 is electrically connected to the light source chip 101, the driver IC 102, the light receiving element and the ICs. Material of the circuit board 100 comprises silicon, silica, ceramic, or dielectric material, or the circuit board 200 is flexible print circuit (FPC) as a substrate.

The output or input optical signal 305 is transmitted through the core 301 of the optical waveguide 300. This means that an optical signal is propagating in total reflection at the core 301 to form a light path 304, and a non-coplanar bending of the optical signal is generated through the reflection surface 303a of the V-shape trench 303. As the light source chip 101 emits light signal and passes through the lens array 201 and 202 of the optical bench 200, the optical signals can be passively coplanar bending (optical reflection) through the mirror or reflective surface 303a, and the optical signals can be guided to the external optical transmission medium, for example optical fiber or other optical waveguide, through the core 301 of the optical waveguide 300. On the contrary, optical signal from the outer optical transmission medium (optical fiber or other optical waveguide) can be transmitted through the core 301 of the optical waveguide 300 and guided by the reflecting surface 303a, and followed by passing through the lens array 201 and 202 of the optical bench 200, and received by the light receiving element.

For the overall photoelectric conversion module structure, some embodiments can be achieved through the optical waveguide for the output and input of external optical signals. For example, some embodiments are described below.

Figure 2:
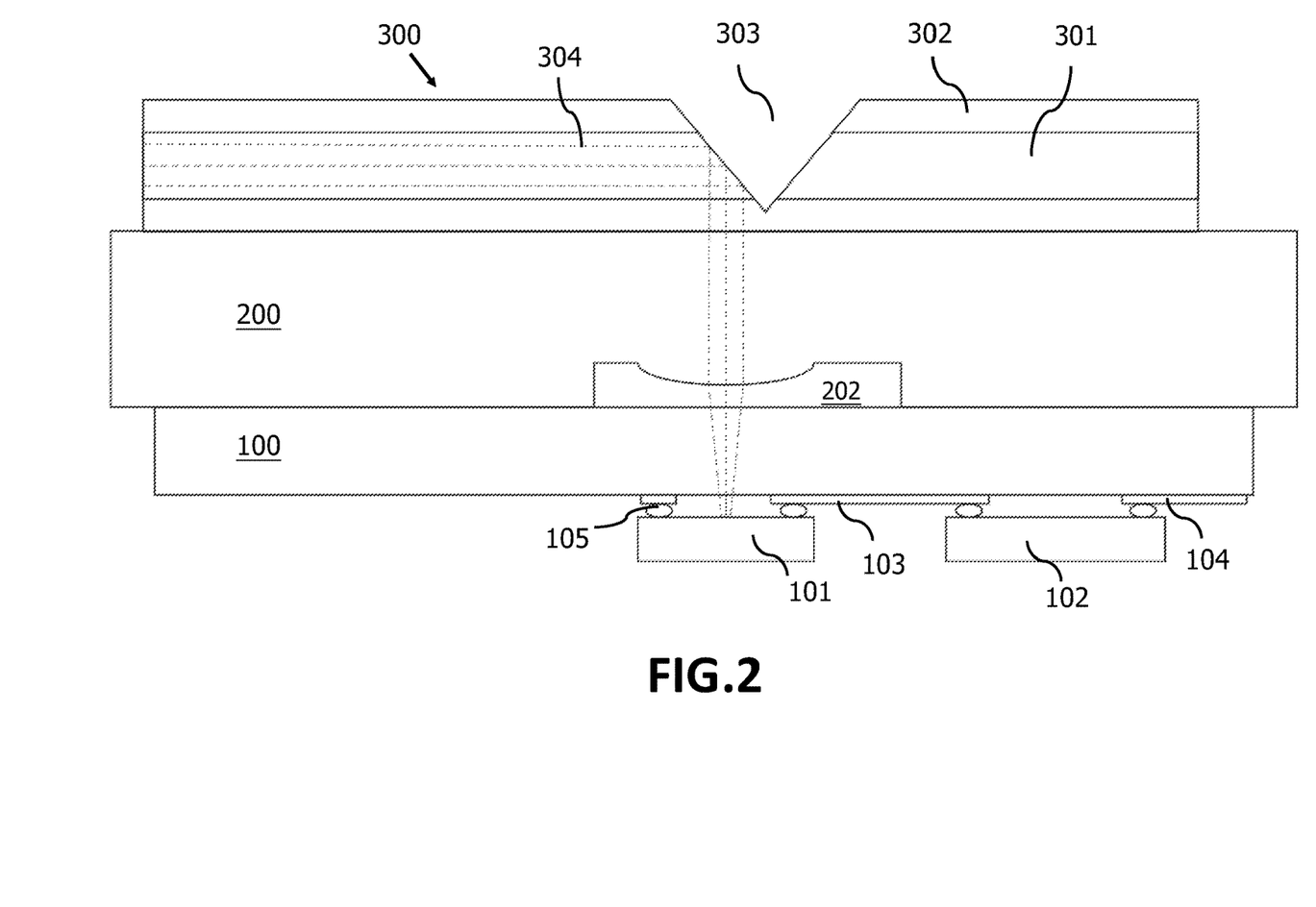
FIG. 2 illustrates a cross-sectional view showing a photoelectric conversion module according to another embodiment of the invention.
Figure 3:
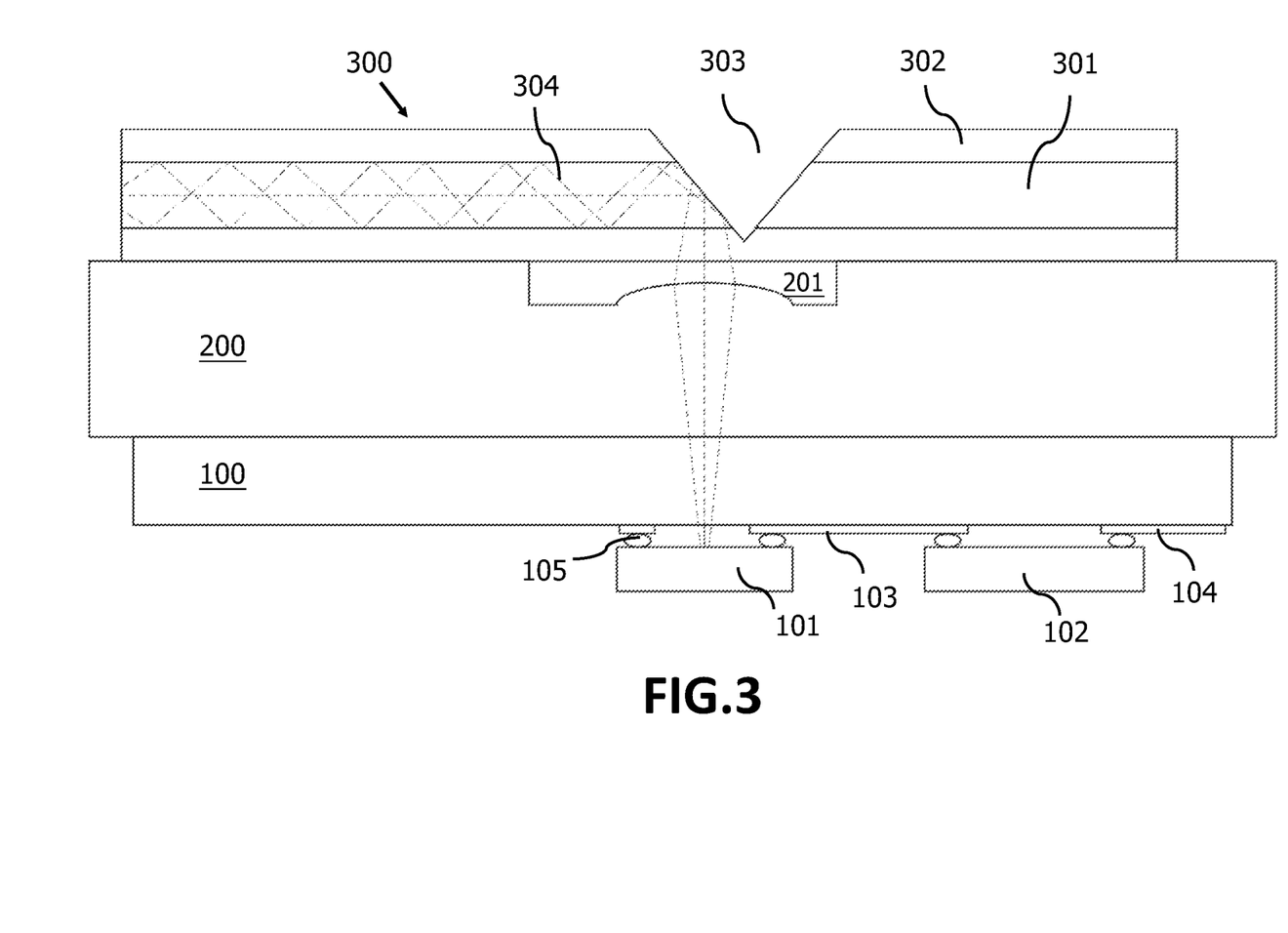
FIG. 3 illustrates a cross-sectional view showing a photoelectric conversion module according to yet another embodiment of the invention.

As shown in FIG. 2, it illustrates a cross-sectional view showing a photoelectric conversion module according to another embodiment of the invention. In this embodiment, the optical bench 200 has a single side lens array 202 configured on the lower surface of the optical bench 200. Since the height of the optical bench 200 is reduced, only one side lens array 202 is used to focus the output or input optical field. In another embodiment, the optical bench 200 has a single side lens array 201 configured under the upper surface of the optical bench 200, as shown in FIG. 3.

Figure 4:
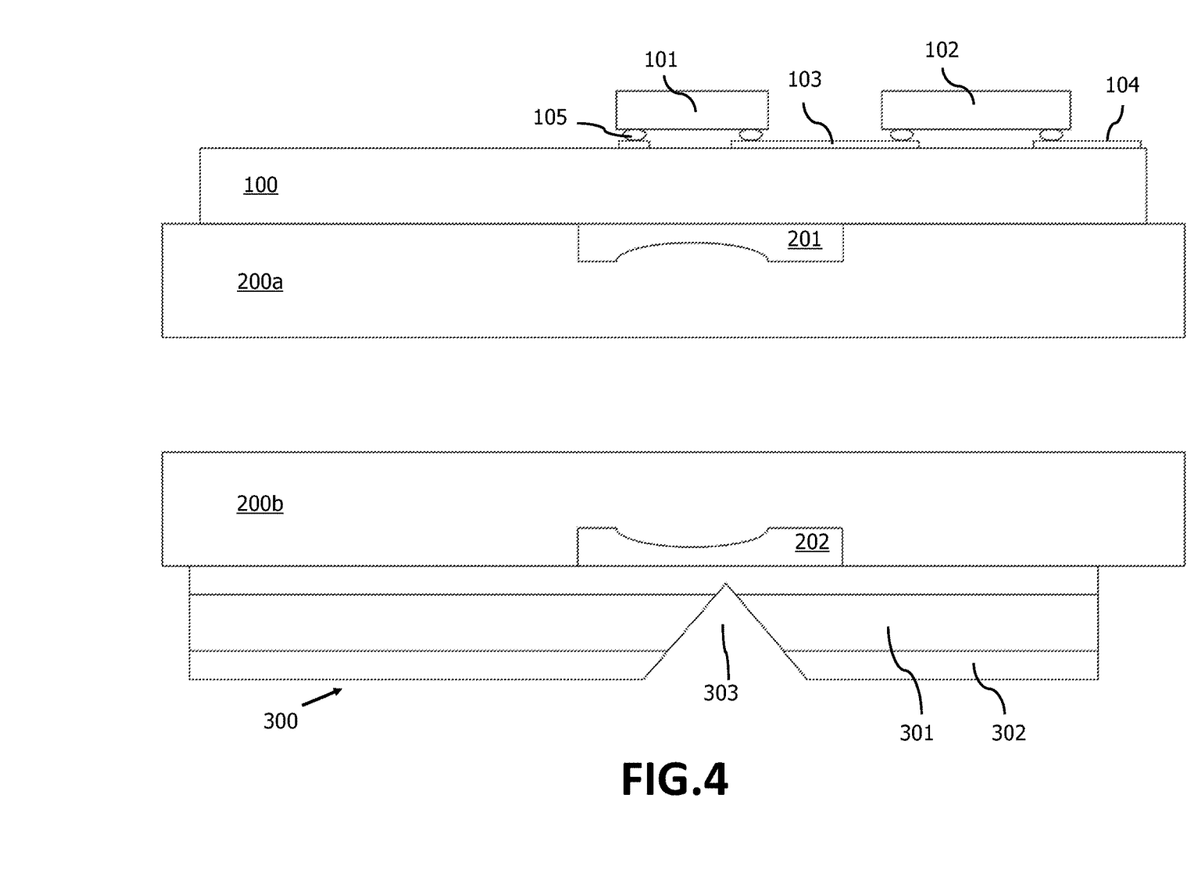
FIG. 4 illustrates a cross-sectional view showing a photoelectric conversion module with double optical bench according to one embodiment of the invention.
Figure 5:
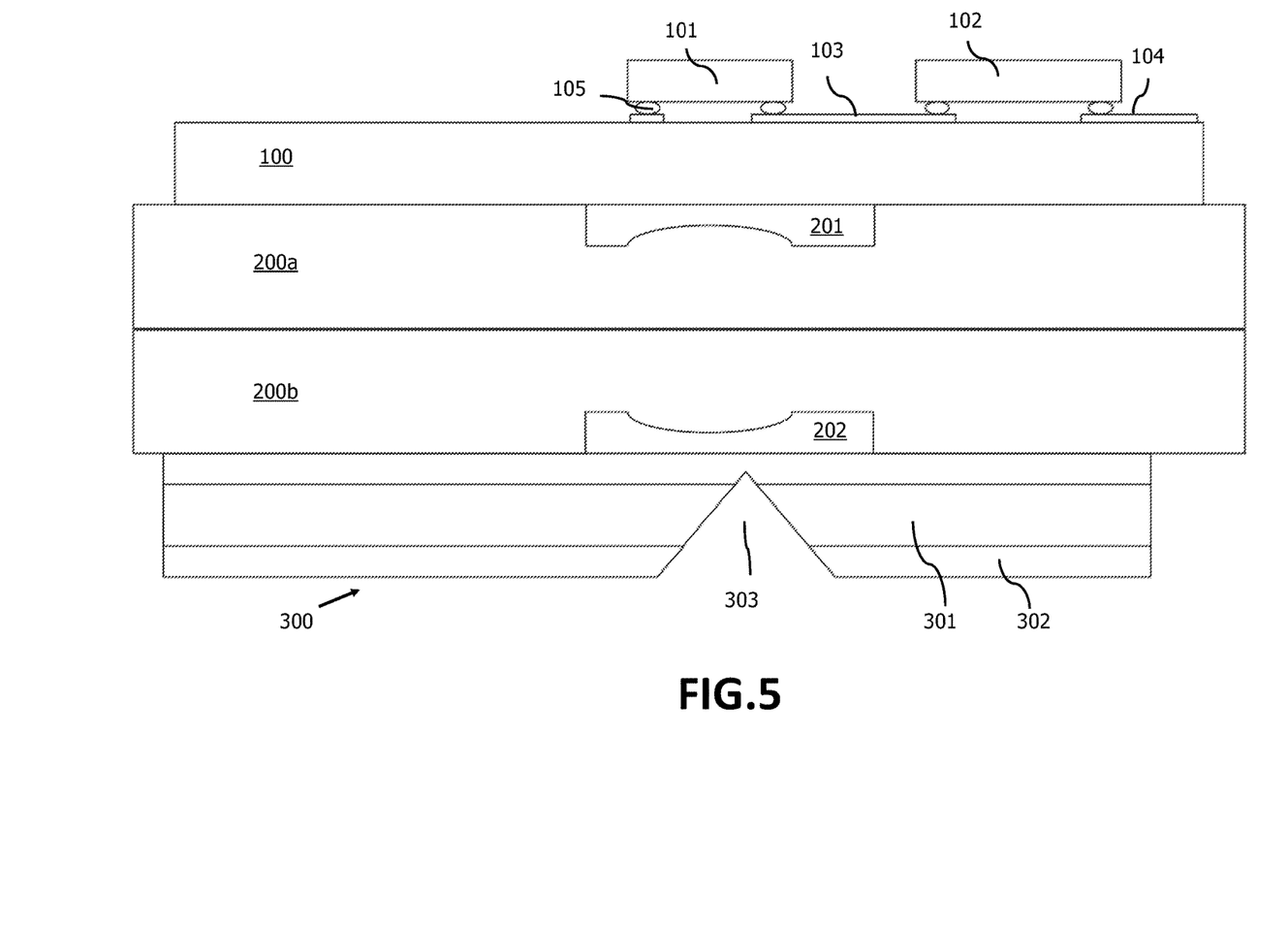
FIG. 5 illustrates a cross-sectional view showing a photoelectric conversion module with double optical bench according to one embodiment of the invention.

In another embodiment, the optical bench of the photoelectric conversion module is constructed by two parts including an optical layer (optical waveguide) integrated onto the first optical bench 200b and a circuit layer (circuit board) integrated onto the second optical platform 200a, as shown in FIG. 4. Namely, the optical signal module and the electrical signal module are independently manufactured and processed. The first optical bench 200b and the second optical bench 200a can be combined with each other by mechanically bonding or adhesively bonding to form a complete photoelectric conversion module which corresponds to the structure of the FIG. 1, as shown in FIG. 5. The first optical bench 200b has a lens array 202, and the second optical bench 200a has a lens array 201. In combining the first optical bench 200b with the second optical bench 200a, the lens array 201 is aligned to the lens array 202.

Next, the output and input of external optical signals through the optical waveguide can be achieved in some embodiments, and illustrated in the following three embodiments.

Figure 6:
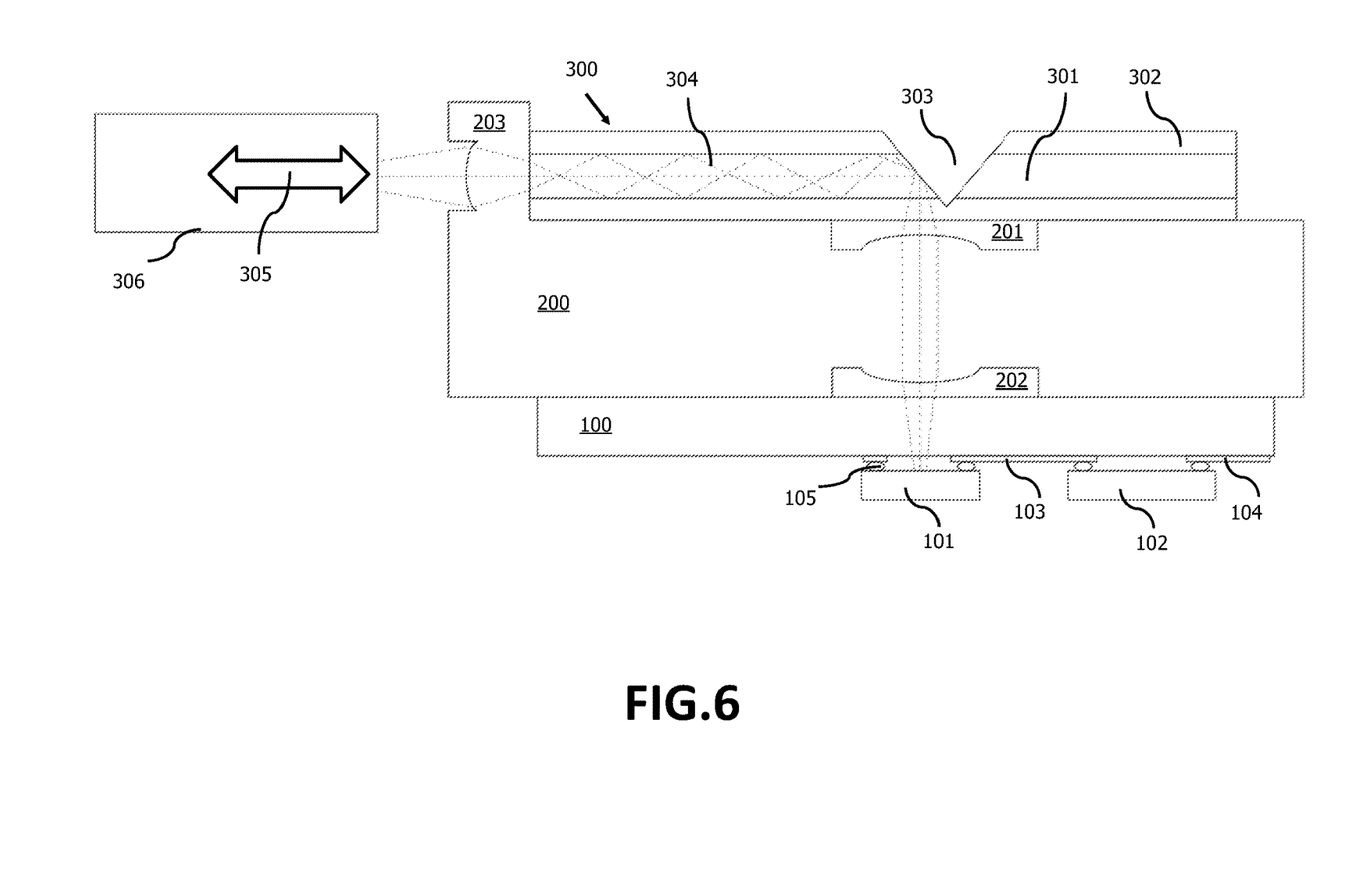
FIG. 6 illustrates a cross-sectional view showing a photoelectric conversion module according to one embodiment of the invention.

As shown in FIG. 6, it illustrates a cross-sectional view showing a photoelectric conversion module according to yet another embodiment of the invention. In the present embodiment, the optical bench 200 has three lens arrays 201, 202, and 203 which locate under (below) the upper surface, over the lower surface, and over the upper surface of the optical bench 200, respectively. That is, on the basis of the photoelectric conversion module of the FIG. 1, the lens array 203 is added onto the optical bench 200 of the photoelectric conversion module structure of FIG. 6, which locates over the upper surface of the optical bench 200 and connects to one end of the optical waveguide 300, wherein the curvature of the lens array 203 is opposite to the front side of the optical waveguide 300, and faces to an external optical component 306. The core 301 of the optical waveguide 300 is aligned to the curved surface of the lens array 203 for optical communication. The lens array 203 can be used to focus the optical signal passing through the core 301 of the optical waveguide 300 to guide into the external optical focusing element 306, or focus the optical signal 305 from the external optical element 306 to guide into the core 301 of the optical waveguide 300. By using the lens array 203, the optical efficiency can be further improved and the allowable value of the process deviation in packaging can be improved, while the external optical path can be created in an optical fiber or another optical waveguide.

In another embodiment, the optical bench 200 has two lens arrays 201 and 203 which locate under (below) the upper surface and over the upper surface of the optical bench 200, respectively. That is, on the basis of the photoelectric conversion module of the FIG. 6, the lens array 202 is omitted. In yet another embodiment, the optical bench 200 has two lens arrays 202 and 203 which locate over the lower surface and over the upper surface of the optical bench 200, respectively. That is, on the basis of the photoelectric conversion module of the FIG. 6, the lens array 201 is omitted.

Figure 7:
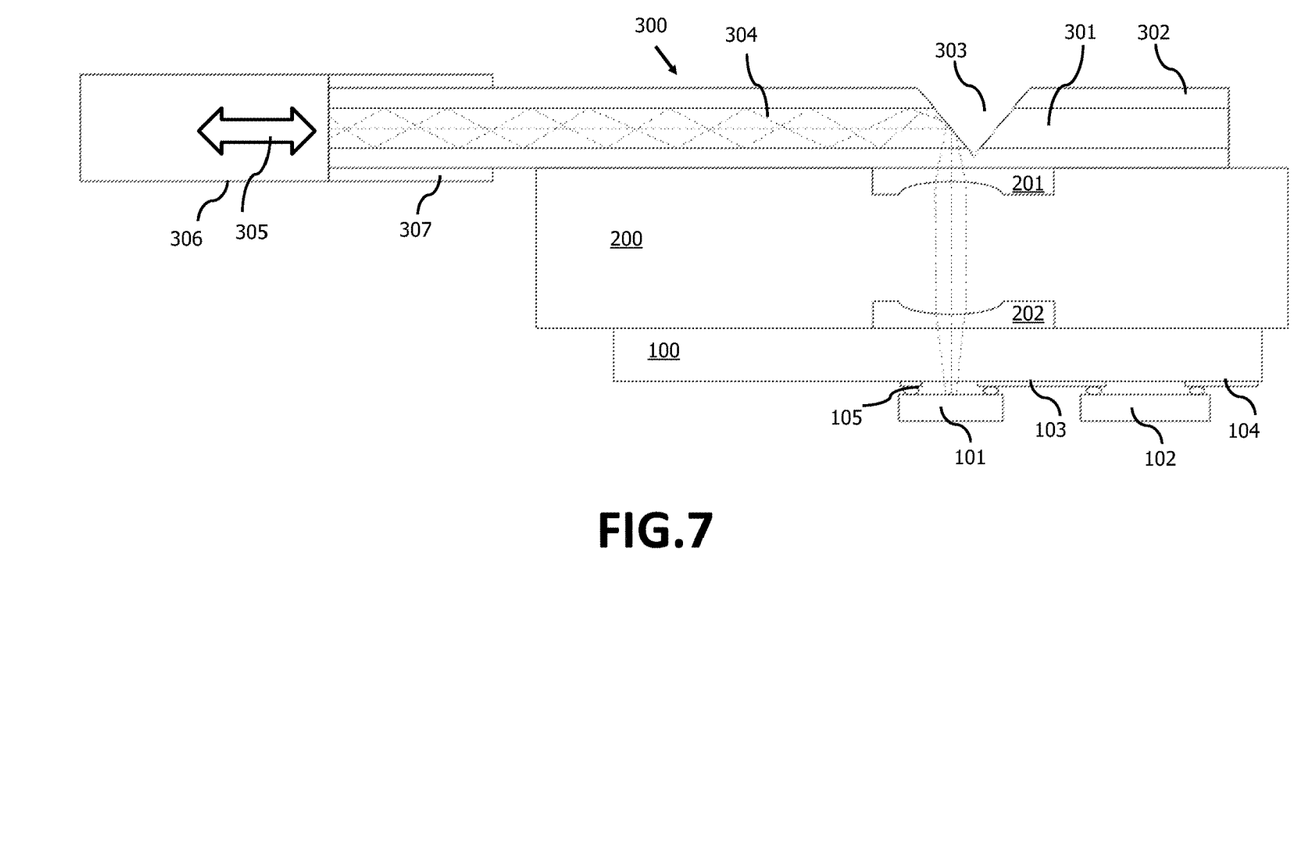
FIG. 7 illustrates a cross-sectional view showing a photoelectric conversion module according to another embodiment of the invention.

As shown in FIG. 7, it shows a cross section diagram of a photoelectric conversion module according to one embodiment of the present invention. In the present embodiment, the length of the optical waveguide 300 is greater than (exceeding) the length of the optical bench 200. One end of the optical waveguide 300 extends outside of the optical bench 200 and is connected to the external optical element 306. An optical connector 307 is processed to form on a connection terminal of the external optical element 306 for connecting to the external light path element 306. The optical connector 307 is conducted for the connection of the external optical element 306, and the connection according to the demand of optical efficiency can be implemented by: (1) direct connection, for example through the MT connector to connect each other; (2) optical connector 307 integrating with lens array, similar to the optical connection structure of FIG. 6, the lens array 203 is integrated within the optical connector 307.

In another embodiment, the optical bench 200 has a single lens arrays 201 which locates below the upper surface of the optical bench 200. That is, on the basis of the photoelectric conversion module of the FIG. 7, the lens array 202 is omitted. In yet another embodiment, the optical bench 200 has a single lens arrays 202 which locate over the lower surface of the optical bench 200. That is, on the basis of the photoelectric conversion module of the FIG. 7, the lens array 201 is omitted.

Figure 8:
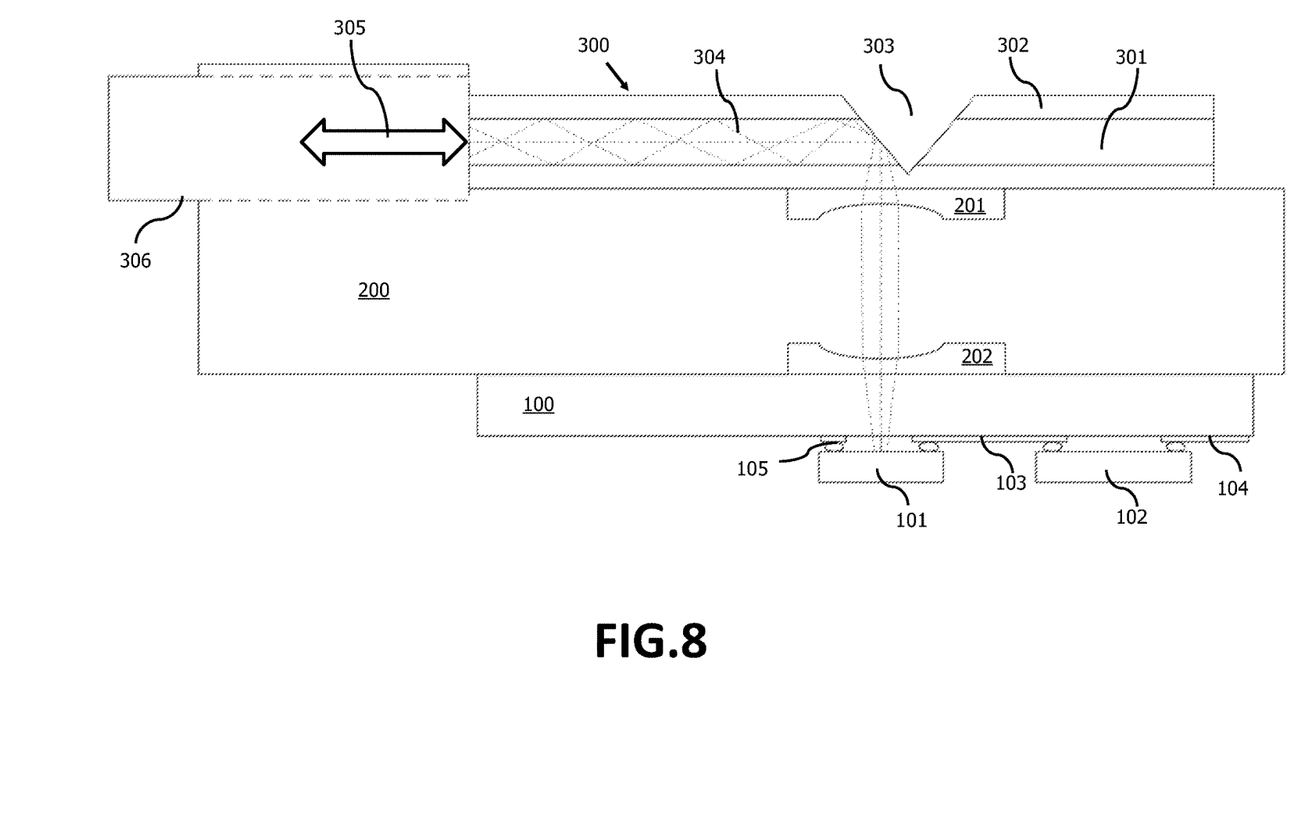
FIG. 8 illustrates cross-sectional view showing a photoelectric conversion module according to yet another embodiment of the invention.

As shown in FIG. 8, it shows a cross section diagram of a photoelectric conversion module according to another embodiment of the present invention. In the present embodiment, the optical bench 200 has two sides lens array 201 and 202 which locate under the upper surface and over the lower surface of the optical bench 200, respectively. The optical bench 200 has a reserve area or space on the upper surface of the optical bench 200, and the external optical element 306 is directly configured onto the upper surface of the optical bench 200. That is, on the basis of the photoelectric conversion module of the FIG. 1, the external optical element 306 is configured onto the upper surface of the optical bench 200 of the photoelectric conversion module structure of FIG. 8, and one end (side) of the external optical element 306 connects to one end (side) of the optical waveguide 300. The connection between the external optical element 306 and the optical bench 200 can be implemented by: (1) direct connection, the external optical element 306 directly aligning to the optical waveguide 300; (2) optical bench 200 integrating with the third lens array, similar to the optical connection structure of FIG. 6, the lens array 203 is integrated within the optical bench 200; by using the lens array 203, the optical efficiency can be further improved and the allowable value of the process deviation in packaging can be improved, while the external optical element can be an optical fiber or another optical waveguide.

In another embodiment, the optical bench 200 of the photoelectric conversion module has a single lens arrays 201 which locates below the upper surface of the optical bench 200. That is, on the basis of the photoelectric conversion module of the FIG. 8, the lens array 202 is omitted. In yet another embodiment, the optical bench 200 of the photoelectric conversion module has a single lens arrays 202 which locates over the lower surface of the optical bench 200. That is, on the basis of the photoelectric conversion module of the FIG. 8, the lens array 201 is omitted.

In addition, the three embodiments shown in FIG. 6 to FIG. 8 illustrates the external optical path connection, and the structure of the optical bench 200 can be also achieved based-on the combination method of FIG. 4 and FIG. 5, which means, the first optical bench 200b and the second optical bench 200a can be combined with each other by mechanically bonding or adhesively bonding to form a complete photoelectric conversion module of FIG. 6 to FIG. 8.

As noted above, in the structure of optical bench 200 with double sides lens array 201 and 202, a divergent beam emitted by the light source chip 101 is changed to an approximately collimated beam by the lens array 202, and then focusing by the lens array 201 and reflecting by the reflection surface 303a, followed by transmitting to outer optical transmission medium (optical fiber or other optical waveguide) through the core 301 of the optical waveguide 300. On the other hand, beam signal created by the external device feeds into the optical fibers, propagating to the core 301 of the optical waveguide 300 and reflecting by the reflection surface 303a, followed by passing through the lens array 201 to form an approximately collimated beam and passing through the lens array 202 and the circuit board 100, and thereby receiving the inputted light by the light receiving element.

In addition, in the structure of optical bench 200 with a single lens array 201 or 202, a divergent beam emitted by the light source chip 101 is changed to an approximately collimated beam by the lens array 202, and then reflecting by the reflection surface 303a, as shown in FIG. 2. Besides, a divergent beam signal created by the external device feeds into the core 301 of the optical waveguide 300, and then reflecting by the reflection surface 303a, followed by passing through the lens array 201 and passing through the lens array 201 and the circuit board 100, and thereby receiving the inputted light by the light receiving element, as shown in FIG. 3.

The photoelectric conversion module has a function of converting a beam signal (via a plurality of optical fibers) from the external electronic device or equipment into an electrical signal, or sending a beam signal to the external electronic device or equipment via a plurality of optical fibers.

In one embodiment, ICs are, for example a driver integrated circuit (IC), a control IC or a trans-impedance amplifier (TIA) chip, or others active components, configured on the circuit board. The driver IC may be used to drive the light source chip (such as optoelectronic device) for emitting light.

The conductive trace 104 on the circuit board 100 may be electrically connected to ICs or the external electronic device by wire bond or flip board mounting for signal connection.

In one embodiment, the circuit board 100 is a flexible substrate.

The light source chip 101 is capable of emitting visible and invisible light. The light source chip 101 is for example a laser or a light emitting diode (LED).

For example, the light source chip 101 and the light detecting chip are flip-chip packaged on the circuit board. Therefore, beam signal emitted by the light source chip 101 passes through the circuit board 100, and passing through the optical bench 200, reflection surface 303a of the V-shape trench 303, and followed by transmitting the beam signal via the core 301 of the optical waveguide 300.

Material and thickness of the optical waveguide may be selected, based-on requirements for practical applications. For example, material of the optical waveguide includes polymer material, dielectric material, such as polyimide.

The optical bench is combined with the flexible optical waveguide for optical communication. Such structure may receive and transmit optical signal through the flexible optical waveguide. Beam signal created by the light source chip may be reflected and transmitted via the optical micro-reflection surface of the V-shape trench of the flexible optical waveguide.

In one embodiment, the flexible optical waveguide includes an under cladding layer, a core and an over cladding layer. Materials of the under cladding layer, the core and the over cladding layer are not specifically limited, and it is possible to used, e.g., an acrylic resin, an epoxy resin and a polyimide resin, etc.

The optical micro-reflection surface locates on optical path to extend between the light source chip 101 (or lens array) and the core for deflecting the optical path.

The circuit board 100 is allowable for optical path penetrating therein, for facilitating light emitted from the light source chip 101 or coming from the external device passing through therein. In another embodiment, the circuit board 100 has a through hole passing through a top surface of the circuit board 100 to a bottom surface of the circuit board 100 allowable for optical path penetrating therein, for facilitating light emitted from the light source chip 101 or coming from the external device passing through therein. Conductive bumps (soldering bumps, metal bumps or Au bumps) 105 are formed on the conductive trace 103 and 104 for coupling to the light source chip 101, the light receiving element, the IC 102 or other ICs.

The conductive trace on the circuit board may be electrically connected to ICs or the external electronic device by wire bond or flip board for signal connection.

The advantages of the invention include:
(1) the optical bench is used as main body of the photoelectric conversion module, and lens array is manufactured within the optical bench, therefore its size can't be affected by other components.
(2) the circuit board is made of suitable materials, such as glass, silicon or ceramic, for facilitating semiconductor process, or flexible substrate material can also be used to produce the required wires (metal trace). LD/PD are flip-chip packaged on the circuit board, the precision of packaging: i). In the horizontal direction (X-axis and Y-axis): due to the lens array 202, it can increase the package's allowable error range; ii). In the vertical direction (Z-axis): by controlling the thickness of the circuit board to achieve precision demand of Z-axis package alignment, it is easy to align for contrast in free space;
(3) the structure of the invention can significantly reduce optical transmission distance in the optical bench, to avoid the decline of optical efficiency of the photoelectric conversion module due to longer optical path within the photoelectric conversion module, and reduce the interference between different channels;
(4) the circuit board needs no groove design, the conductive trace is directly formed on the circuit board, and the optical element and the integrated circuit can be directly electrically connected to each other through the conductive trace, without the need of additional bonding wires;
(5) optical elements are flip-chip mounted on the circuit board, and electrically connected to the conductive trace on the circuit board; based on the flip-chip packaging process, the active region of the optical elements is toward the upper surface of the circuit board, i.e. the light path directly passing through the circuit board; and therefore the optical elements can be directly electrically connected to the conductive trace on the circuit board without extra bonding wires to make electrical connection; the invention has simple structure than prior art's structure.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A photoelectric conversion module, comprising:
a first plastic optical bench formed with a first lens array;
a circuit board having conductive trace formed thereon, wherein said circuit board is configured on said first plastic optical bench;
at least one optical element flip-chip configured on said circuit board;
a second plastic optical bench formed with a second lens array which aligns to said first lens array; and
an optical waveguide attached onto an upper surface of said second plastic optical bench, wherein said optical waveguide has a V-shape trench formed therein;
wherein said first plastic optical bench is mechanically or adhesively bonded with said second plastic optical bench.

2. The photoelectric conversion module of claim 1, wherein at least one passive component is configured on said circuit board.

3. The photoelectric conversion module of claim 1, wherein said at least one optical element is coupled to said conductive trace on said circuit board.

4. The photoelectric conversion module of claim 3, wherein said optical waveguide is made of a flexible material.

5. The photoelectric conversion module of claim 1, wherein said first lens array aligns to said at least one optical element and said second lens array aligns to said V-shape trench.

6. The photoelectric conversion module of claim 5, wherein said at least one optical element is coupled to said conductive trace on said circuit board.

7. The photoelectric conversion module of claim 5, wherein said optical waveguide is made of a flexible material.

8. The photoelectric conversion module of claim 1, further comprising a third lens array aligning to one end of said optical waveguide.

9. The photoelectric conversion module of claim 1, wherein one end of said optical waveguide extends outside of said second plastic optical bench to connect to an external optical element.

10. The photoelectric conversion module of claim 1, further comprising an external optical element configured on said second plastic optical bench.

11. The photoelectric conversion module of claim 10, wherein said at least one optical element is a light source chip, a photo diode chip, a photo detector chip or a photo-sensitive chip.

12. The photoelectric conversion module of claim 11, wherein said optical waveguide is made of a flexible material.

13. The photoelectric conversion module of claim 1, wherein said at least one optical element is a light source chip, a photo diode chip, a photo detector chip or a photo-sensitive chip.

14. The photoelectric conversion module of claim 1, further comprising at least one IC formed on said circuit board.

15. The photoelectric conversion module of claim 14, wherein said at least one IC is a driver integrated circuit (IC), a control IC or a trans-impedance amplifier (TIA) chip.

16. The photoelectric conversion module of claim 1, wherein said circuit board is attached on said first plastic optical bench by using an adhesive material.

17. The photoelectric conversion module of claim 1, wherein said optical waveguide is made of a flexible material.

* * * * *